(12) United States Patent
Lee

(10) Patent No.: US 11,735,653 B2
(45) Date of Patent: Aug. 22, 2023

(54) SEMICONDUCTOR DEVICE

(71) Applicants: Hyundai Motor Company, Seoul (KR); KIA Motors Corporation, Seoul (KR)

(72) Inventor: JongSeok Lee, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 93 days.

(21) Appl. No.: 17/170,995

(22) Filed: Feb. 9, 2021

(65) Prior Publication Data
US 2022/0157987 A1   May 19, 2022

(30) Foreign Application Priority Data

Nov. 13, 2020 (KR) .................. 10-2020-0151702

(51) Int. Cl.
*H01L 29/78* (2006.01)
*H01L 29/10* (2006.01)
*H01L 29/423* (2006.01)

(52) U.S. Cl.
CPC ...... *H01L 29/7813* (2013.01); *H01L 29/1033* (2013.01); *H01L 29/1095* (2013.01); *H01L 29/4236* (2013.01)

(58) Field of Classification Search
CPC ............ H01L 29/7813; H01L 29/1033; H01L 29/1095; H01L 29/4236; H01L 27/0617–0635; H01L 27/0705–0738; H01L 27/088–0883; H01L 29/66325–66348; H01L 29/7393–7398; H01L 29/0696; H01L 29/7375; H01L 29/7397; H01L 29/66333–66348; H01L 29/66712–66734; H01L 29/7802–7815; H01L 29/7812; H01L 29/7824; H01L 29/4238; H01L 29/7827; H01L 29/0607; H01L 29/0684; H01L 29/42356; H01L 29/42376

See application file for complete search history.

(56) References Cited

U.S. PATENT DOCUMENTS

2020/0212183 A1* 7/2020 Utsumi ............. H01L 29/66734
2020/0243641 A1* 7/2020 Nakagawa ............ H01L 29/083

* cited by examiner

*Primary Examiner* — Cuong B Nguyen
(74) *Attorney, Agent, or Firm* — McDonnell Boehnen Hulbert & Berghoff LLP

(57) ABSTRACT

An exemplary semiconductor device may include a substrate, an N− epitaxial layer positioned on the substrate, a first P region and a second P region positioned apart from each other on the N− epitaxial layer, a first N+ region positioned within the first P region, a second N+ region positioned within the second P region, and a gate layer positioned between the first P region and the second P region.

14 Claims, 13 Drawing Sheets

SEMICONDUCTOR DEVICE

CROSS-REFERENCE TO RELATED APPLICATIONS

This application claims priority to and the benefit of Korean Patent Application No. 10-2020-0151702 filed in the Korean Intellectual Property Office on Nov. 13, 2020, the entire contents of which are incorporated herein by reference.

FIELD

The present disclosure relates to a semiconductor device, and more particularly, to a semiconductor device for improving a current density by combining a trench gate device and a planar gate device.

BACKGROUND

In recent years, depending on a large-scale and large-capacity trend of application devices, a need for power semiconductor devices having a high breakdown voltage, a high current, and a high-speed switching characteristic has emerged.

Such a power semiconductor device particularly requires low on-resistance or a low saturation voltage in order to reduce a power loss in a conduction state while allowing a very large current to flow. In addition, a characteristic of being capable of withstanding a reverse high voltage of a PN junction applied to opposite ends of the power semiconductor device, that is, a high breakdown voltage characteristic, is basically required in an off state or when a switch is turned off.

In manufacturing a power semiconductor device, concentration and thickness of an epi region or a drift region of a raw material used are determined depending on a rated voltage of the semiconductor device. An increase in a surface electric field at an interface between a semiconductor and a dielectric must be minimized by appropriately dispersing an electric field induced by expansion of a depletion layer in a reverse bias mode of the PN junction by appropriately utilizing a PN junction structure, and devices must be designed to withstand an inherent critical electric field of the raw material in breakdown of the power semiconductor device, in order to obtain an appropriate breakdown voltage at a desired level with the concentration and thickness of the raw material required by breakdown voltage theory.

The above information disclosed in this Background section is only for enhancement of understanding of the background of the present disclosure, and therefore it may contain information that does not form the prior art that is already known in this country to a person of ordinary skill in the art.

SUMMARY

The present disclosure provides a semiconductor device improving a current density.

An exemplary semiconductor device may include a substrate, an N− epitaxial layer positioned on the substrate, a first P region and a second P region positioned apart from each other on the N− epitaxial layer, a first N+ region positioned within the first P region, a second N+ region positioned within the second P region, and a gate layer positioned between the first P region and the second P region.

The first P region may include a third P region positioned between the first N+ region and the gate layer. The second P region may include a fourth P region positioned between the second N+ region and the gate layer.

The gate layer may include a region positioned between the first N+ region and the second N+ region by etching a part of the first P region and a part of the second P region.

The gate layer may include a first gate layer positioned between a protruded third P region among the first P region and a protruded fourth P region among the second P region, and a second gate layer positioned between the first N+ region and the second N+ region by etching a part of the first P region and a part of the second P region.

As for the N− epitaxial layer, a depth of the first gate layer may be lower than a depth of the second gate layer.

The gate layer may include a first gate layer positioned between a protruded third P region among the first P region and a protruded fourth P region among the second P region. A channel may be formed in a surface of the third P region facing the first gate layer, and a channel may be formed in a surface of the fourth P region facing the first gate layer.

A width of the first gate layer may be narrower than a width of the second gate layer.

An exemplary semiconductor device may further include a gate insulation layer positioned between the first P region and the gate layer and between the second P region and the gate layer.

An exemplary semiconductor device may include a substrate, an N− epitaxial layer positioned on the substrate, a plurality of first P regions and a plurality of second P regions positioned apart from each other on the N− epitaxial layer, a first N+ region positioned adjacent to the plurality of first P regions, a second N+ region positioned adjacent to the plurality of second P regions, and a plurality of first gate layers positioned between the plurality of first P regions and the plurality of second P regions.

An exemplary semiconductor device may further include a third P region connected to the plurality of first P regions, and a fourth P region connected to the plurality of second P regions. The first N+ region may be positioned between the plurality of first P regions and the third P region. The second N+ region may be positioned between the plurality of second P regions and the fourth P region.

An exemplary semiconductor device may further include a plurality of second gate layers positioned between the third P region and the fourth P region.

As for the N− epitaxial layer, a depth of the plurality of first gate layers may be lower than a depth of the plurality of second gate layers.

The plurality of first gate layers and the plurality of second gate layers may be alternately positioned, and formed as a single.

An exemplary semiconductor device may further include a gate insulation layer positioned between the third P region and the plurality of second gate layers and between the fourth P region and the plurality of second gate layers.

A channel may be formed in the plurality of first P regions at surfaces facing the first gate layer, and a channel may be formed in the plurality of second P regions at surfaces facing the first gate layer.

An exemplary semiconductor device may further include a gate insulation layer positioned between the plurality of first P regions and the plurality of first gate layers and between the plurality of second P regions and the plurality of first gate layers.

According to a semiconductor device according to an exemplary embodiment, density of channel is increased to improve current density.

DETAILED DESCRIPTION

Figure 1:
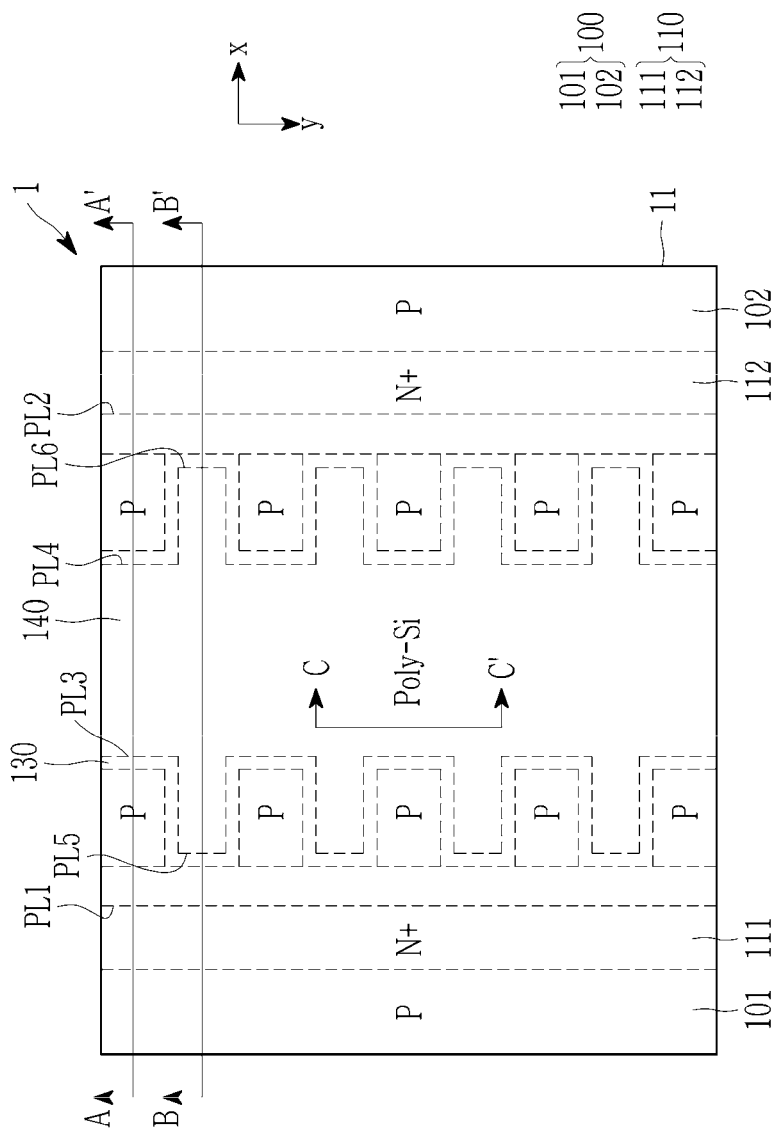
FIG. 1 is a drawing showing a plan view of a semiconductor device according to an exemplary embodiment.

The present disclosure relates to a semiconductor device, and more particularly, to a semiconductor device for improving a current density by combining a trench gate device and a planar gate device.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a semiconductor device according to an exemplary embodiment is described in detail with reference to the drawings.

FIG. 1 is a drawing showing a plan view of a semiconductor device according to an exemplary embodiment.

As shown in FIG. 1, in the plan view of a semiconductor device 1, an internal structure of the semiconductor device 1 indicated by dotted lines may not be seen by a source electrode 11.

A top surface of gate layer 140 (which can be a polysilicon layer) extends to N+ regions 111 and 112, and has boundaries PL1 and PL2. A trench of some region of the gate layer 140 is positioned between a boundary PL3 and a boundary PL4. A trench of some other region of the gate layer 140 is positioned between a boundary PL5 and a boundary PL6.

Hereinafter, for better understanding, an exemplary embodiment is described with reference to FIG. 2, in which the source electrode 11, a part of a gate insulation layer 130, and a part of the gate layer 140 are removed.

Figure 2:
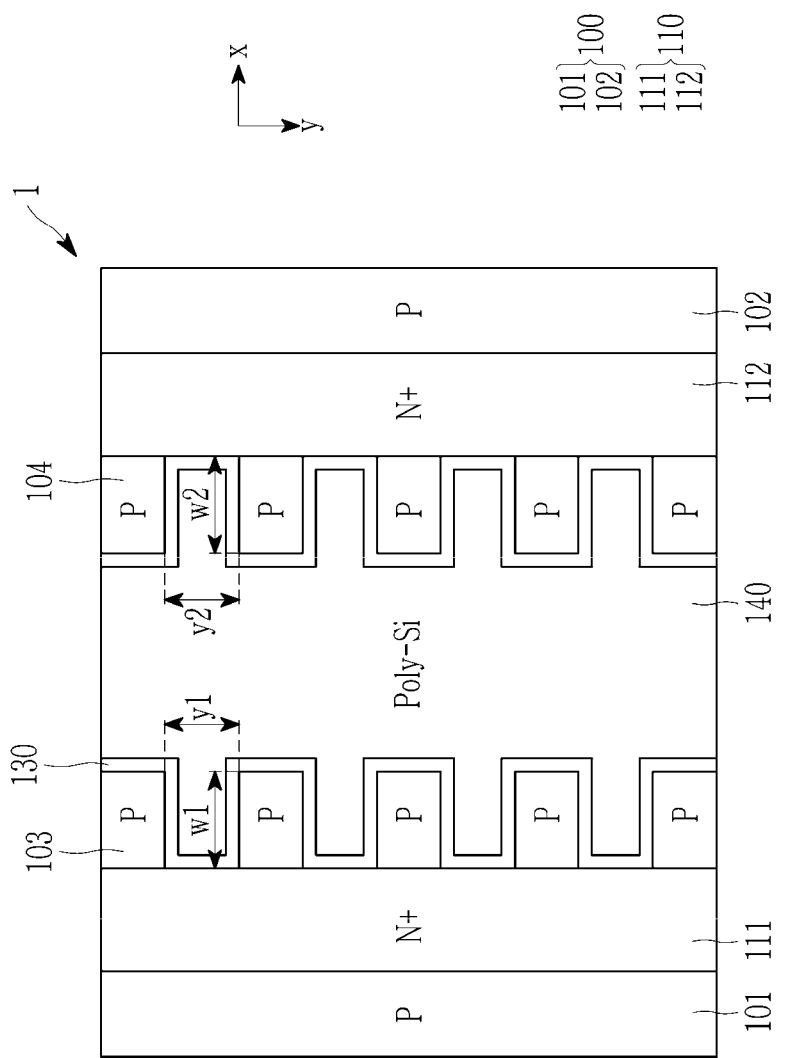
FIG. 2 shows a plan view of a semiconductor device according to an exemplary embodiment in which an upper portion is partially removed.

FIG. 2 shows a plan view of a semiconductor device according to an exemplary embodiment in which an upper portion is partially removed.

Figure 3:
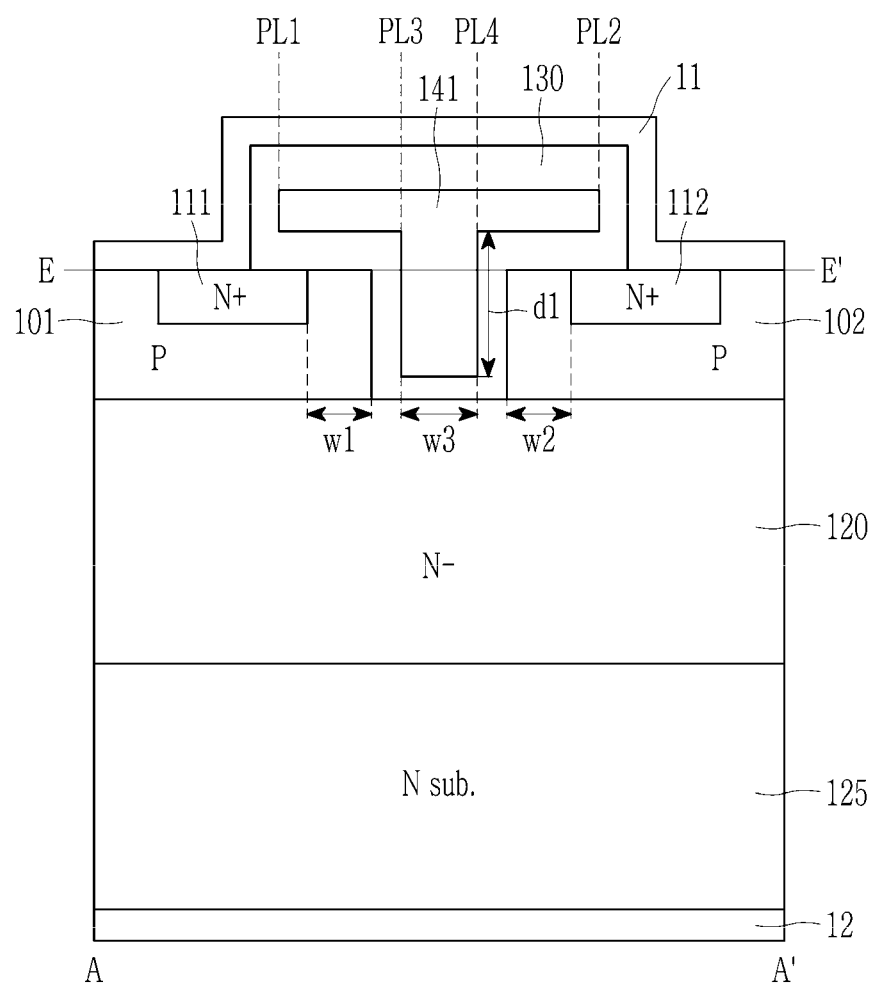
FIG. 3 is a sectional view taken along line A-A' of FIG. 1.

FIG. 3 is a sectional view taken along line A-A' of FIG. 1.

Figure 4:
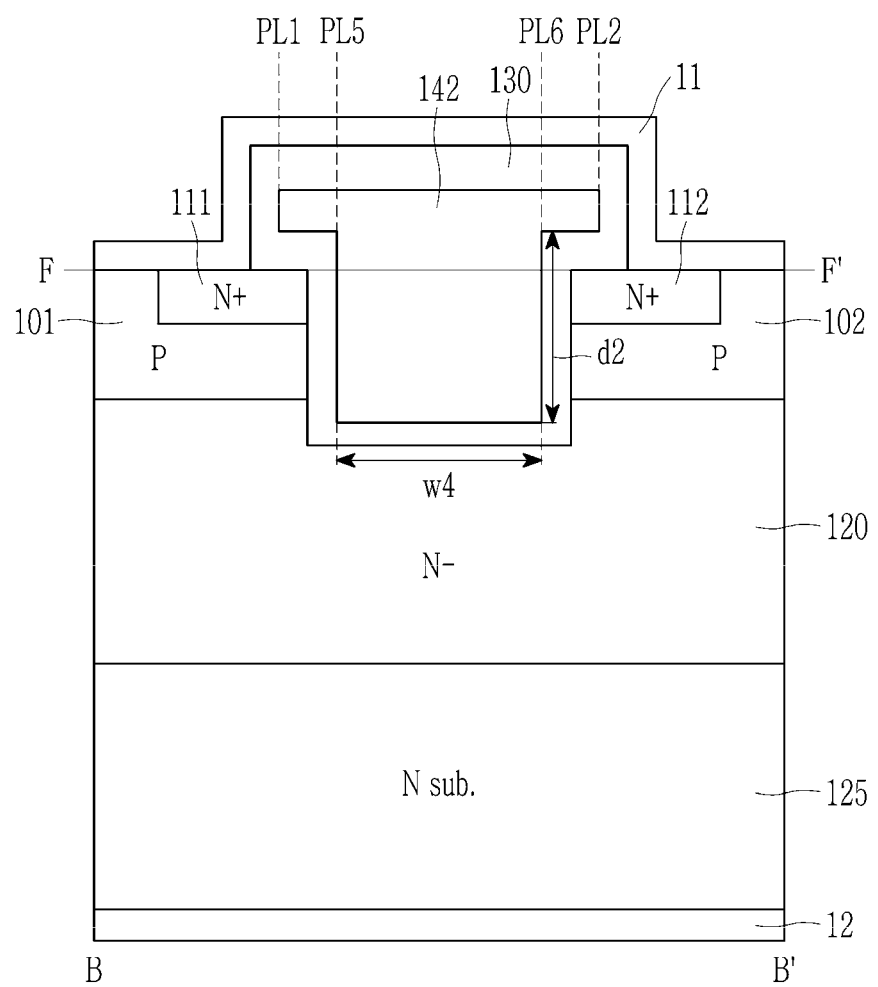
FIG. 4 is a sectional view taken along line B-B' of FIG. 1.

FIG. 4 is a sectional view taken along line B-B' of FIG. 1.

Lines E-E' and F-F' in cross-sectional views of FIG. 3 and FIG. 4 are the same. FIG. 2 is a top plan view showing the semiconductor device 1 when the configuration above the lines E-E' and F-F' is removed from FIG. 1.

As shown in FIG. 2, P regions 101 and 102 include protruded P regions 103 and 104 extending by predetermined widths w1 and w2 toward a center of the semiconductor device 1 along an x-direction, and the protruded P regions 103 and 104 may be positioned along a y-direction at regular intervals y1 and y2.

As shown in FIG. 1 to FIG. 4, the semiconductor device 1 includes a P region 100, an N+ region 110, an N– epitaxial layer 120, an N substrate (N sub.) 125, the gate insulation layer 130, a gate layer 140, the source electrode 11, and a drain electrode 12.

First, an N substrate 125 is positioned on the drain electrode 12, and the N– epitaxial layer 120 is positioned on the N substrate 125. The P regions 101 and 102 spaced apart from each other are positioned on the N– epitaxial layer 120.

As shown in FIG. 3 and FIG. 4, the N+ regions 111 and 112 are positioned on the P regions 101 and 102.

As shown in FIG. 3, a gate layer 141 is insulated by the gate insulation layer 130 and is positioned between the two P regions 101 and 102. The source electrode 11 may be positioned on the gate insulation layer 130. At this time, as shown in FIG. 3, a width of the P region 101 is wider than a width of the N+ region 111, and is extended from a right-side boundary of the N+ region 111 by a predetermined width w1. In addition, a width of the P region 102 is wider than a width of the N+ region 112, and is extended from a left-side boundary of the N+ region 112 by a predetermined width w2.

In FIG. 4, a gate layer 142 is insulated by the gate insulation layer 130, and is positioned between the P region 101 and the N+ region 111 and between the P region 102 and the N+ region 112. The source electrode 11 may be positioned on the gate insulation layer 130. At this time, as shown in FIG. 3, the width of the P region 101 is wider than the width of the N+ region 111, and the right-side boundary of the N+ region 111 and a right-side boundary of the P region 101 coincide. The width of the P region 102 is wider than the width of the N+ region 112, and the left-side boundary of the N+ region 112 and a left-side boundary of the P region 102 coincide.

As shown in FIG. 3 and FIG. 4, the gate layer 140 according to an exemplary embodiment includes two types of gate structures. For example, the gate layer 141 shown in FIG. 3 and a gate layer 142 shown in FIG. 4 are in a structure combining a flat gate and a trench gate (hereinafter, referred to as a combined structure), and a width w4 and a depth d2 of the trench gate shown in FIG. 4 are wider and deeper than a width w3 and a depth d1 of the trench gate shown in FIG. 3.

As shown in FIG. 2, the gate layer 141 and the gate layer 142 are alternately positioned along the y-direction, and the gate layer 141 may be positioned in a space formed by etching the N− epitaxial layer 120 positioned between the gate layer 142. That is, a gate layer of the trench structure is formed by etching the N− epitaxial layer 120 between the protruded P region 103 and P region 104, and thereby a JFET region does not exist in the N− epitaxial layer 120 between the protruded P region 103 and P region 104. Then, a region affecting a flow of current flowing through a channel, due to a conventional JFET region, is removed, and accordingly, resistance may be removed, and an additional vertical channel may be formed, thereby increasing the current flowing through the channel.

Figure 5:
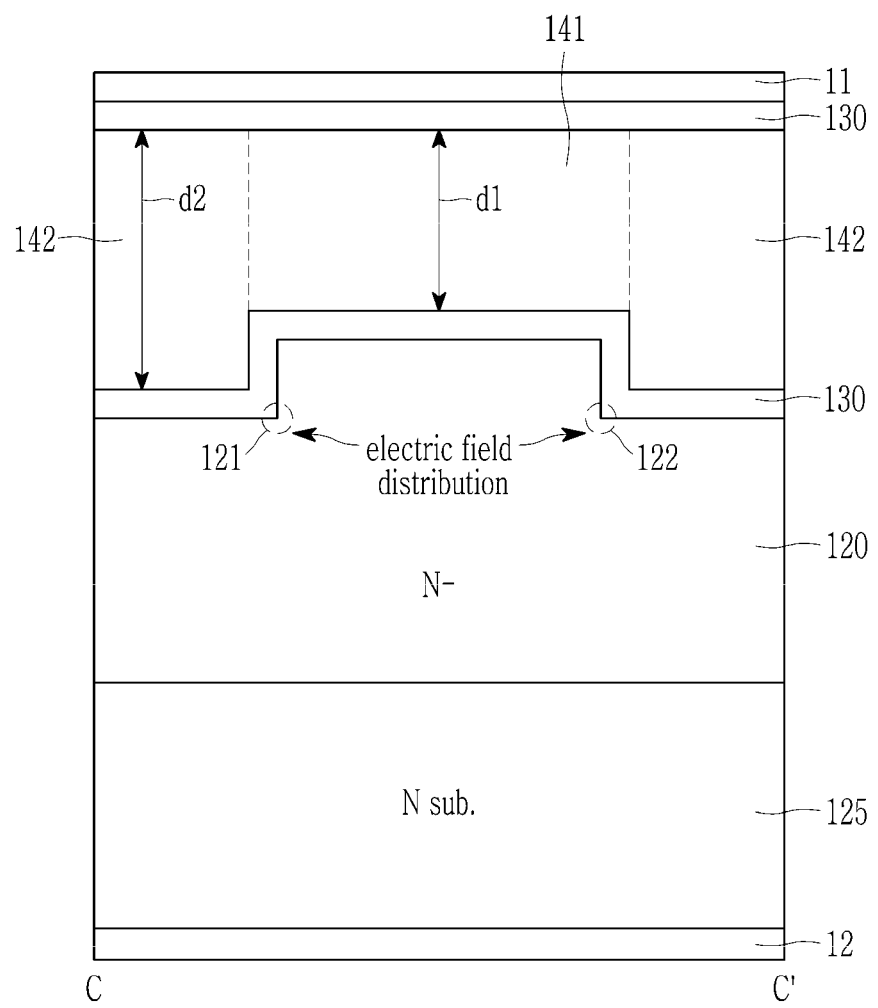
FIG. 5 is a sectional view taken along line C-C' of FIG. 1

FIG. 5 is a sectional view taken along line C-C' of FIG. 1

As shown in FIG. 5, a trench depth d1 of the gate layer 141 is lower than a trench depth d2 of the gate layer 142. When a trench depth of the gate layer 141 is deeper than a trench depth of the gate layer 142 differently from FIG. 5, electric fields are concentrated to a lower end of the trench of the gate layer 141, thereby decreasing the breakdown voltage. In order to prevent such, as shown in FIG. 5, the trench depth d1 is formed smaller than the trench depth d2 such that the electric fields may be distributed to two points 121 and 122 where depth step of the gate layer occurs.

Hereinafter, a channel formed between the P region and the gate insulation layer when a voltage of an ON-level (e.g., positive voltage) is applied to the gate layer is described in detail with reference to the drawings.

Figure 6:
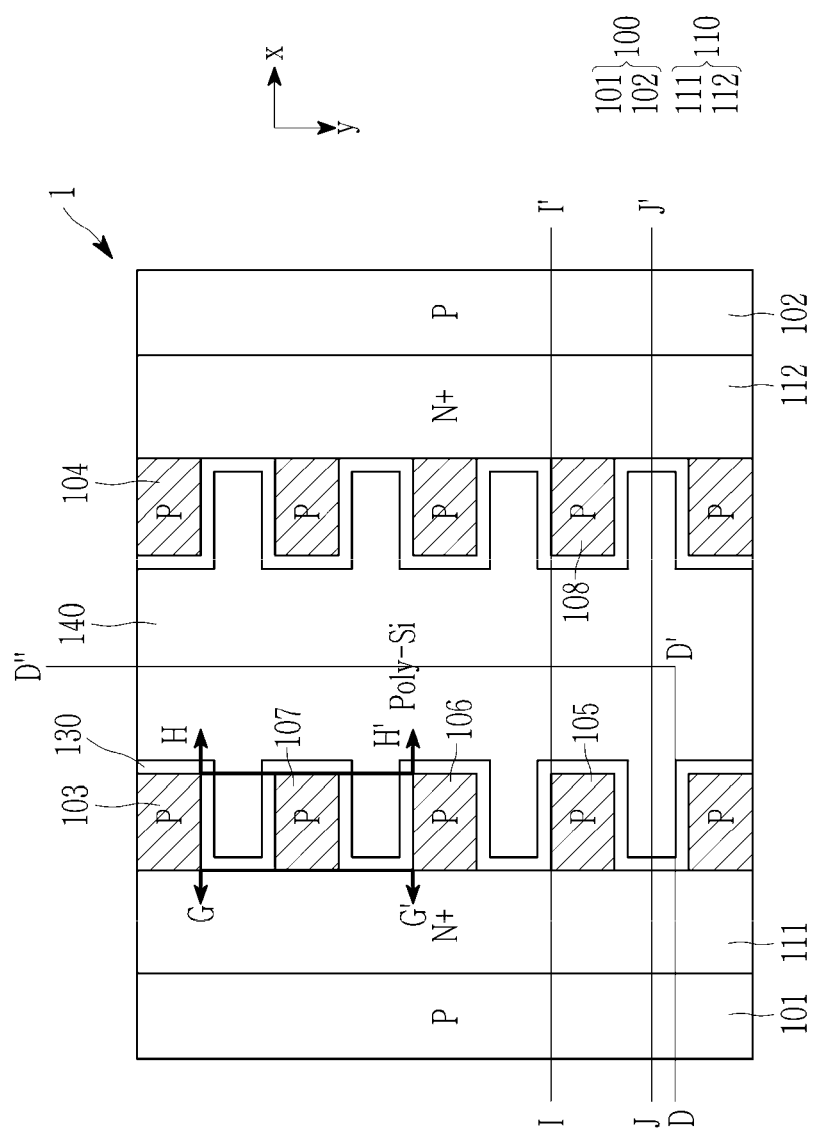
FIG. 6 illustrates a channel of a semiconductor device shown in a plan view of FIG. 2

FIG. 6 illustrates a channel of a semiconductor device shown in a plan view of FIG. 2

Figure 7:
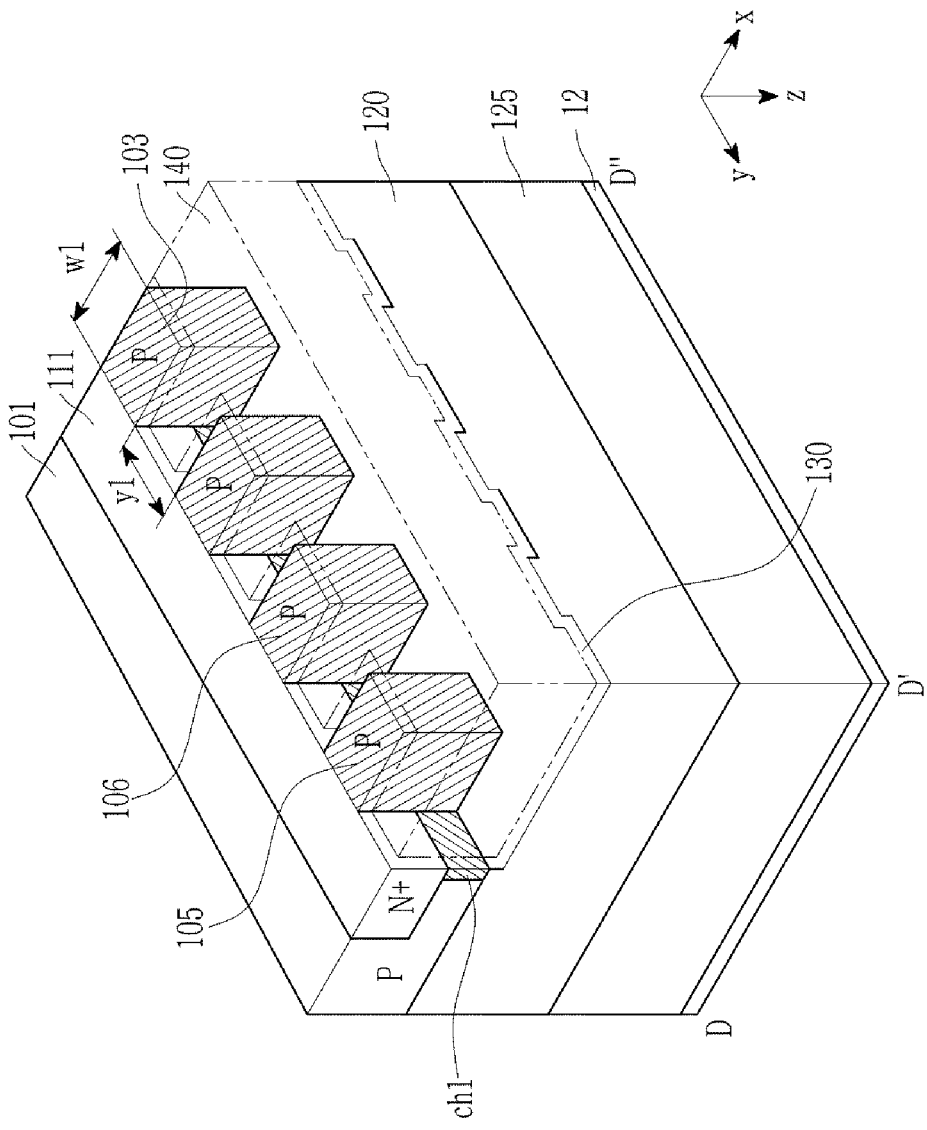
FIG. 7 is perspective sectional view taken along D-D'-D" of FIG. 6

FIG. 7 is perspective sectional view taken along D-D'-D" of FIG. 6

In the drawings, as well as FIG. 6 and FIG. 7, the planar gate channel is indicated by oblique lines in ＼ direction, i.e., from the top-left to the bottom-right, and the trench gate channel is indicated by oblique lines in ／ direction, i.e., from the top-right to the bottom-left. The planar gate channel and the trench gate channel may be formed into a surface of P regions by a predetermined depth, and the planar gate channel and the trench gate channel are differentiable according to the moving direction of electrons. Electrons in the planar gate channel are charges flowing along an xy plane of FIG. 7, and electrons in the trench gate channel are charges flowing along z-direction of FIG. 7.

As shown in FIG. 6, the planar gate channel is formed in upper surfaces of a plurality of protruded P regions 103 and 104. Although not shown in FIG. 6, the upper surfaces of the plurality of protruded P regions 103 and 104 may be in contact with the gate insulation layer 130.

In FIG. 7, the gate insulation layer 130 and the gate layer 140 are shown in a see-through manner. This is for more clearly illustrate the planar gate channel and the trench gate channel formed in the P region.

As shown in FIG. 7, the trench gate channel ch1 is formed into a surface of the P region 101 positioned to a lower portion of the N+ region 111, by a predetermined depth. A trench gate channel that is the same as the trench gate channel ch1 is formed between two protruded P regions 105 and 106, on a surface of the P region 101 positioned in a lower portion of the N+ region 111.

The planar gate channel and the trench gate channel are hereinafter described in further detail with reference to FIG. 8 to FIG. 13.

Figure 8:
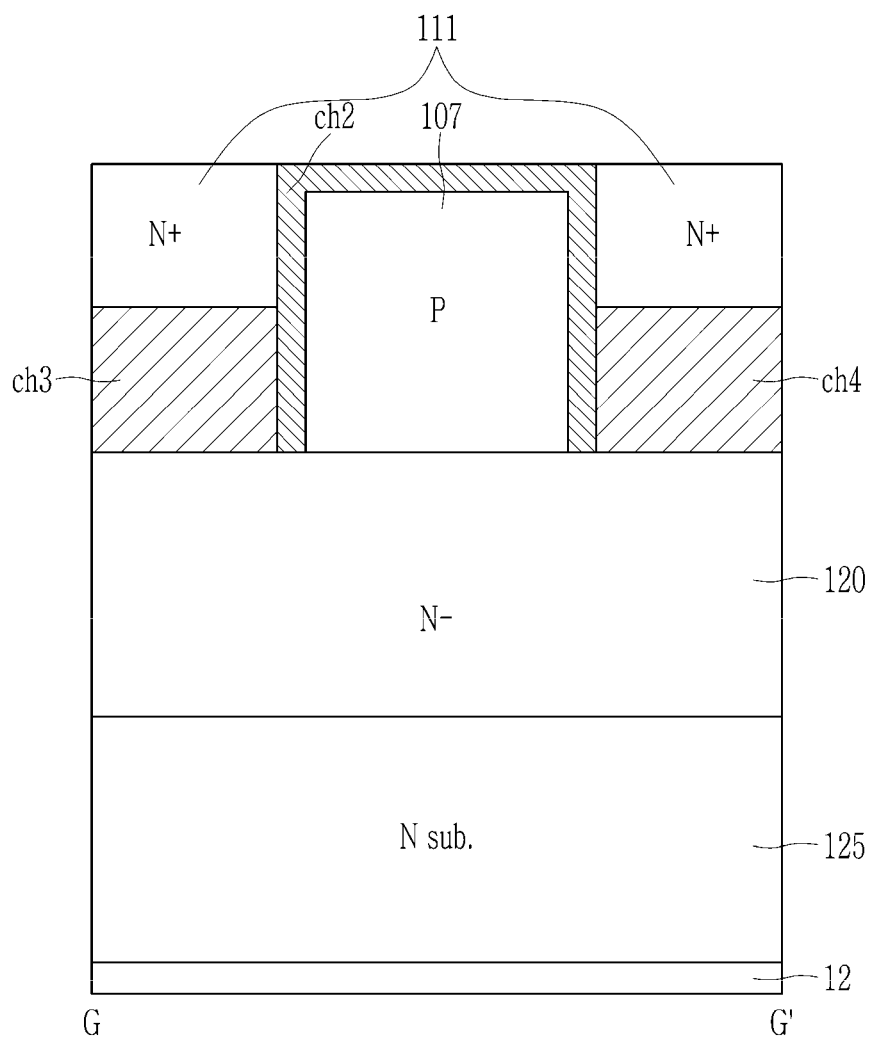
FIG. 8 is a sectional view taken along line G-G' of FIG. 6

FIG. 8 is a sectional view taken along line G-G' of FIG. 6

As shown in FIG. 8, the planar gate channel ch2 formed into a surface of P region 107 by a predetermined depth. The trench gate channel ch3 is formed into a surface of the P region 101 positioned at a lower portion of the N+ region 111, between two protruded P regions 106 and 107. The trench gate channel ch4 is formed into a surface of the P region 101 positioned at a lower portion of the N+ region 111, between two protruded P regions 107 and 103.

Figure 9:
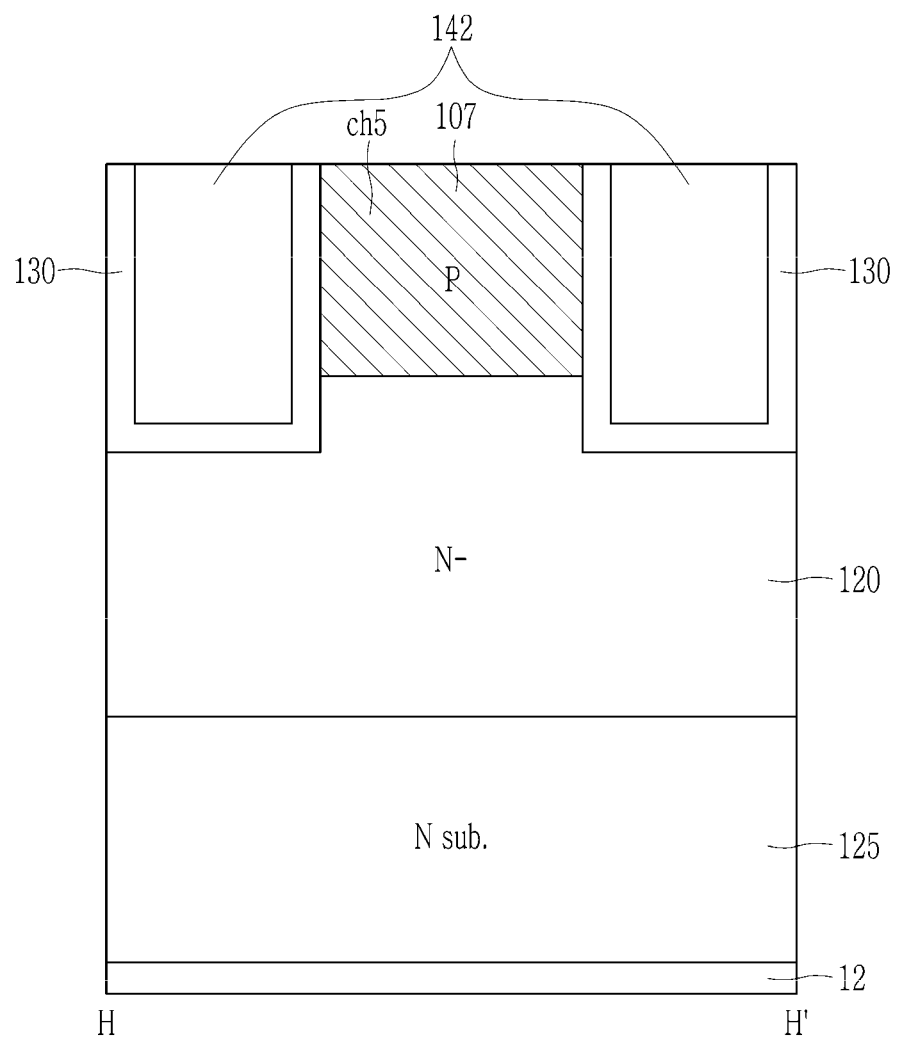
FIG. 9 is a sectional view taken along line H-H' of FIG. 6

FIG. 9 is a sectional view taken along line H-H' of FIG. 6

As shown in FIG. 9, the planar gate channel ch5 is formed in a surface of the P region 107.

Figure 10:
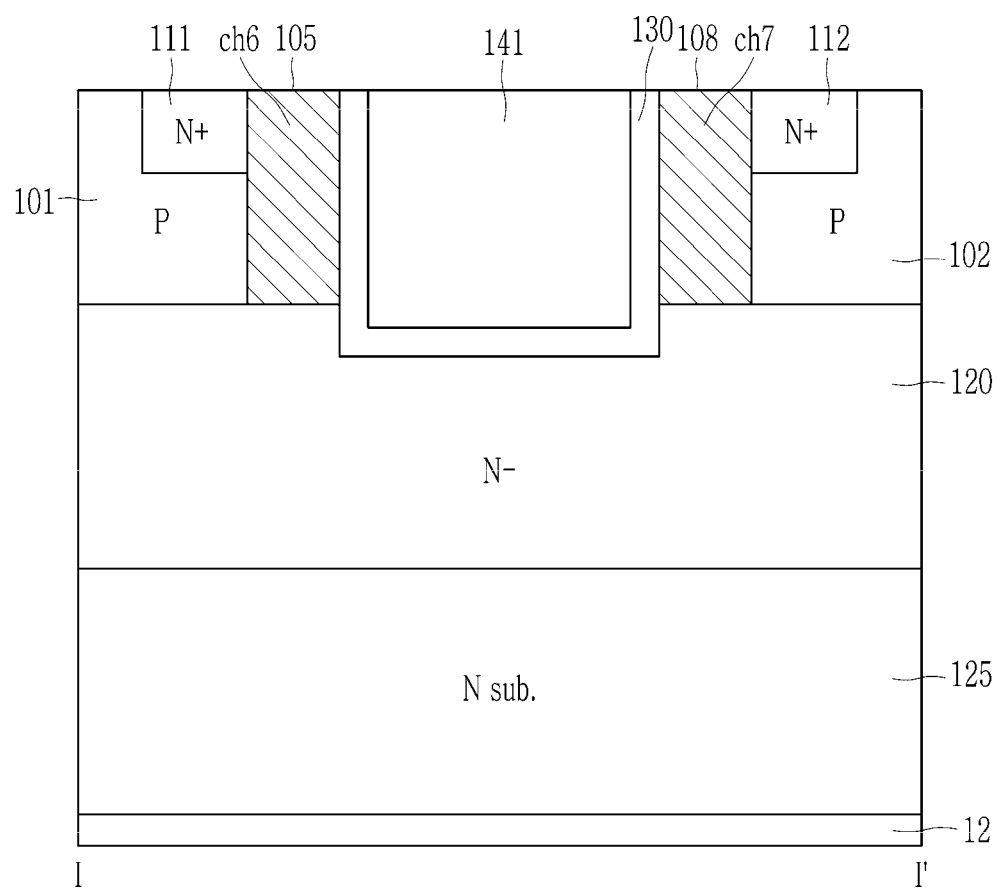
FIG. 10 is a sectional view taken along line I-I' of FIG. 6

FIG. 10 is a sectional view taken along line I-I' of FIG. 6

As shown in FIG. 10, the planar gate channel ch6 is formed in a surface of a protruded P region 105 positioned between the N+ region 111 and the gate layer 141, and the planar gate channel ch7 is formed in a surface of a protruded P region 108 positioned between the N+ region 112 and the gate layer 141.

Figure 11:
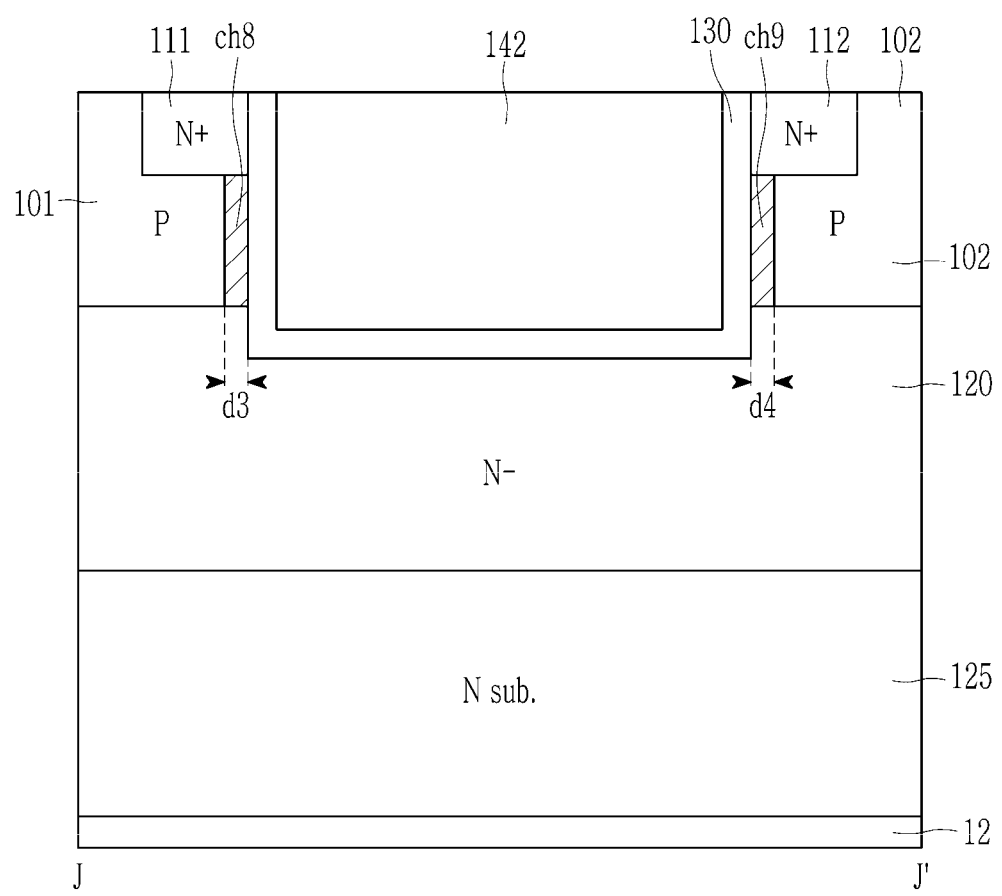
FIG. 11 is a sectional view taken along line J-J' of FIG. 6

FIG. 11 is a sectional view taken along line J-J' of FIG. 6

As shown in FIG. 11, the trench gate channel ch8 is formed into a surface of the P region 101 positioned at a lower portion of the N+ region 111 by a predetermined depth d3, and the trench gate channel ch9 is formed into a surface of the P region 102 positioned at a lower portion of the N+ region 112 by a predetermined depth d4.

As such, in a semiconductor device according to an exemplary embodiment, the N− epitaxial layer 120 between a protruded P region (e.g., 103) and a protruded P region (e.g., 104) facing each other in the x-direction in FIG. 6 is etched to form the gate layer 141 of a poly-silicon layer. Then, a width of a channel formed in the P region increases, and the number of channel surfaces also increases. For example, the planar gate channel ch5 shown in FIG. 9 represent the increased channel surfaces, and the current flows through the channel ch5. Then, unlike the conventional art, the current flows through the channel without passing through the JFET region. Therefore, according to a semiconductor device according to an exemplary embodiment, the current may flow to the drain electrode 12 without being decreased by the resistance of the JFET region.

Figure 12:
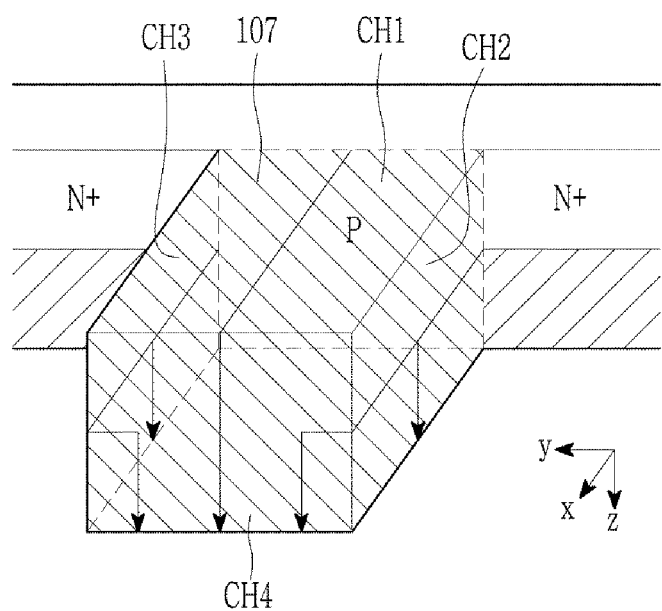
FIG. 12 shows channel surface and flow of current in a semiconductor device according to an exemplary embodiment.

FIG. 12 shows channel surface and flow of current in a semiconductor device according to an exemplary embodiment.

Figure 13:
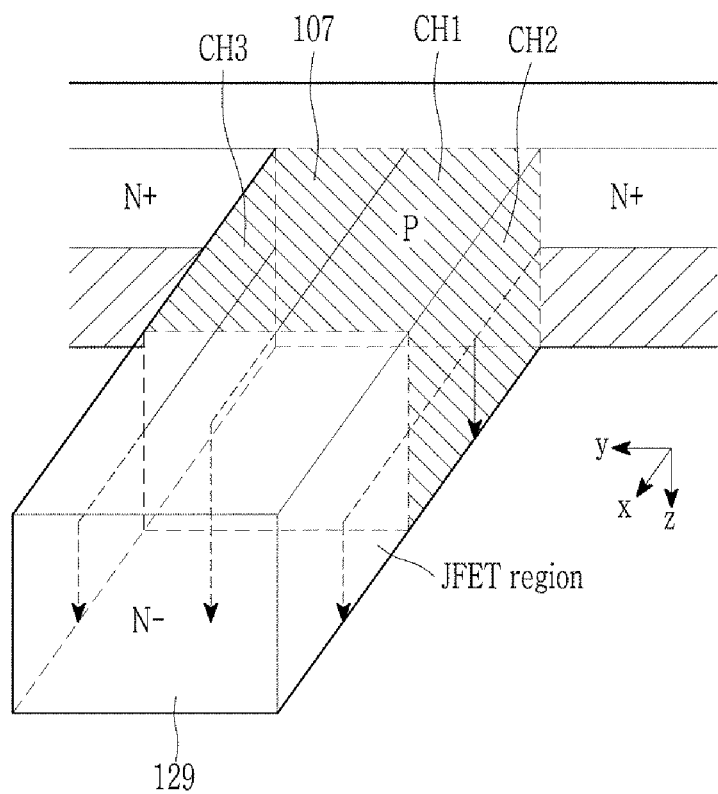
FIG. 13 illustrates a comparative example for describing an exemplary embodiment.

FIG. 13 illustrates a comparative example for describing an exemplary embodiment.

As shown in FIG. 12, four channel surfaces CH1, CH2, CH3, and CH4 are formed in the protruded surface of the P region 107. As may be understood from the flow of the current indicated by arrows, the current flowing through the channel surface CH1 directly flows to the drain electrode 12 along the channel surface CH4, i.e., in the z-direction in FIG. 12, without passing through the JFET region. In addition, a part of the current flowing through the channel surfaces CH2 and CH3 also flows to the drain electrode 12 along the channel surface CH4.

When an N− epitaxial layer 129 other than the gate layer 141 of an exemplary embodiment exists in a space in front of the protruded the P region 107 in the x-direction as shown in FIG. 13, that space is a JFET region.

Then, the current indicated as dotted lines in FIG. 13 flows through the JFET region, and thereby decreases by the resistance of the JFET region.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor device, comprising:
a substrate;
an N− epitaxial layer positioned on the substrate;
a first P region and a second P region positioned apart from each other on the N− epitaxial layer;
a first N+ region positioned within the first P region;
a second N+ region positioned within the second P region; and
a gate layer positioned between the first P region and the second P region,
wherein the gate layer comprises:
a first gate layer positioned between a protruded third P region among the first P region and a protruded fourth P region among the second P region, and wherein:
the protruded third P region is positioned between the first N+ region and the gate layer; and
the protruded fourth P region is positioned between the second N+ region and the gate layer.

2. The semiconductor device of claim 1, wherein the gate layer comprises a region positioned between the first N+ region and the second N+ region by etching a part of the first P region and a part of the second P region.

3. The semiconductor device of claim 1, wherein the gate layer further comprises:
a second gate layer positioned between the first N+ region and the second N+ region by etching a part of the first P region and a part of the second P region.

4. The semiconductor device of claim 3, wherein, as for the N− epitaxial layer, a depth of the first gate layer is lower than a depth of the second gate layer.

5. The semiconductor device of claim 3, wherein a width of the first gate layer is narrower than a width of the second gate layer.

6. The semiconductor device of claim 1, wherein:
a channel is formed in a surface of the protruded third P region facing the first gate layer, and a channel is formed in a surface of the protruded fourth P region facing the first gate layer.

7. The semiconductor device of claim 1, further comprising a gate insulation layer positioned between the first P region and the gate layer and between the second P region and the gate layer.

8. A semiconductor device, comprising:
a substrate;
an N− epitaxial layer positioned on the substrate;
a plurality of first P regions and a plurality of second P regions positioned apart from each other on the N− epitaxial layer;
a first N+ region positioned adjacent to the plurality of first P regions;
a second N+ region positioned adjacent to the plurality of second P regions;
a plurality of first gate layers positioned between the plurality of first P regions and the plurality of second P regions;
a third P region connected to the plurality of first P regions;
a fourth P region connected to the plurality of second P regions; and
a plurality of second gate layers positioned between the third P region and the fourth P region,
wherein the first N+ region is positioned between the plurality of first P regions and the third P region, and
wherein the second N+ region is positioned between the plurality of second P regions and the fourth P region.

9. The semiconductor device of claim 8, wherein, as for the N− epitaxial layer, a depth of the plurality of first gate layers is lower than a depth of the plurality of second gate layers.

10. The semiconductor device of claim 9, wherein the plurality of first gate layers and the plurality of second gate layers are alternately positioned, and formed as a single.

11. The semiconductor device of claim 8, further comprising a gate insulation layer positioned between the third P region and the plurality of second gate layers and between the fourth P region and the plurality of second gate layers.

12. The semiconductor device of claim 8, wherein:
a channel is formed in the plurality of first P regions at surfaces facing the plurality of first gate layers; and
a channel is formed in the plurality of second P regions at surfaces facing the plurality of first gate layers.

13. The semiconductor device of claim 8, further comprising a gate insulation layer positioned between the plurality of first P regions and the plurality of first gate layers and between the plurality of second P regions and the plurality of first gate layers.

14. A semiconductor device, comprising:
a substrate;
an N− epitaxial layer positioned on the substrate;
a plurality of first P regions and a plurality of second P regions positioned apart from each other on the N− epitaxial layer by a first direction facing each other;
a first N+ region positioned adjacent to the plurality of first P regions;
a second N+ region positioned adjacent to the plurality of second P regions; and
a plurality of first gate layers positioned between the plurality of first P regions and the plurality of second P regions;
a third P region connected to the plurality of first P regions;
a fourth P region connected to the plurality of second P regions; and
a plurality of second gate layers positioned between the third P region and the fourth P region,
wherein the plurality of first P regions are positioned apart from each other along a second direction orthogonal to the first direction and the plurality of second P regions are positioned apart from each other along the second direction.

* * * * *